United States Patent
Holla et al.

(10) Patent No.: US 8,755,239 B2
(45) Date of Patent: Jun. 17, 2014

(54) READ ASSIST CIRCUIT FOR AN SRAM

(75) Inventors: Lakshmikantha V. Holla, Karnataka (IN); Vinod J. Menezes, Karnataka (IN); Theodore W. Houston, Richardson, TX (US); Michael Patrick Clinton, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 413 days.

(21) Appl. No.: 13/298,825

(22) Filed: Nov. 17, 2011

(65) Prior Publication Data

US 2013/0128680 A1 May 23, 2013

(51) Int. Cl.
G11C 8/08 (2006.01)
G11C 11/417 (2006.01)
G11C 11/413 (2006.01)

(52) U.S. Cl.
CPC .............. *G11C 8/08* (2013.01); *G11C 11/413* (2013.01); *G11C 11/417* (2013.01)
USPC ...... 365/206; 365/154; 365/156; 365/189.11; 365/230.06; 365/189.06

(58) Field of Classification Search
CPC ....... G11C 8/08; G11C 11/413; G11C 11/417
USPC .......... 365/154, 156, 185.23, 185.25, 189.06, 365/189.11, 203, 204, 206, 230.06
See application file for complete search history.

(56) References Cited

U.S. PATENT DOCUMENTS

| | | | |
|---|---|---|---|
| 5,010,521 A * | 4/1991 | Matsui | 365/189.14 |
| 6,724,648 B2 * | 4/2004 | Khellah et al. | 365/154 |
| 7,505,345 B2 * | 3/2009 | Wang et al. | 365/207 |
| 7,570,525 B2 * | 8/2009 | Nii et al. | 365/189.11 |
| 7,643,372 B2 * | 1/2010 | Yamagami | 365/230.06 |
| 7,961,500 B2 * | 6/2011 | Shinozaki | 365/154 |

* cited by examiner

*Primary Examiner* — J. H. Hur
(74) *Attorney, Agent, or Firm* — John R. Pessetto; W. James Brady; Frederick J. Telecky, Jr.

(57) ABSTRACT

A memory circuit includes a bit cell that receives a word line, complementary bit lines and an array supply voltage; a word line driver coupled to the word line, the word line driver receiving one of the array supply voltage and a periphery supply voltage; and a word line suppression circuit coupled to the word line. The word line suppression circuit includes a diode and a switch coupled in series. The switch is responsive to the array supply voltage. The word line suppression circuit limits a word line voltage to a value lower than the array supply voltage such that the static noise margin (SNM) of the bit cell is increased.

9 Claims, 6 Drawing Sheets

READ ASSIST CIRCUIT FOR AN SRAM

TECHNICAL FIELD

Embodiments of the disclosure relate to memory circuits and specifically to a read assist circuits in static random access memories (SRAM).

BACKGROUND

Static random access memory (SRAM) has become the memory technology of choice for much of the solid-state data storage requirements in these modern power-conscious electronic systems. As is fundamental in the art, SRAM memory cells store contents "statically", in that the stored data state remains latched in each cell so long as power is applied to the memory; this is in contrast to "dynamic" RAM ("DRAM"), in which the data are stored as charge on solid-state capacitors, and must be periodically refreshed in order to be retained.

Advances in semiconductor technology in recent years have enabled shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits. However, physical scaling of device sizes raises significant issues in connection with such embedded memory.

A problem encountered in connection with embedded SRAM memory now realized by modern manufacturing technology stems from the increased variability in the electrical characteristics of transistors formed at these extremely small feature sizes. This variability in characteristics has been observed to increase the likelihood of read and write functional failures, on a cell-to-cell basis. The combination of increased device variability with the larger number of memory cells (and thus transistors) within an integrated circuit renders a higher likelihood that one or more cells cannot be read or written as expected.

A particular failure mode that has been observed in conventional modern SRAM memories is the failure related to the switching of the state of an SRAM cell in a read operation. The read operation of an SRAM results in the internal node holding the zero to rise up due to the voltage division along the driver and pass transistor. When the rise is beyond a threshold, it can result in the bit flipping due to regenerative feedback and hence loss of stored data.

SUMMARY

An example embodiment provides a memory circuit. The memory circuit includes a bit cell that receives a word line, complementary bit lines and an array supply voltage; and a word line driver coupled to the word line. The word line driver receives one of the array supply voltage and a periphery supply voltage. A word line suppression circuit is coupled to the word line. The word line suppression circuit includes a diode and a switch coupled in series. The switch is responsive to the array supply voltage. In various embodiments, the bit cell includes an SRAM.

Another example embodiment provides memory circuit. The memory circuit includes a bit cell that receives a word line, complementary bit lines and an array supply voltage; and a word line driver coupled to the word line. The word line receives the array supply voltage. A word line suppression circuit is coupled to the word line. The word line suppression circuit includes a PMOS transistor coupled to the word line, and a diode and an NMOS transistor coupled in series, where the diode coupled to the word line. The NMOS transistor and the PMOS transistor are responsive to a control signal.

Another example embodiment provides a memory circuit. The memory circuit includes a bit cell receiving a word line, complementary bit lines and an array supply voltage; and a word line suppression circuit coupled to the word line that controls a slew rate of word line. The word line suppression circuit includes a pre word line driver and a final word line driver.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
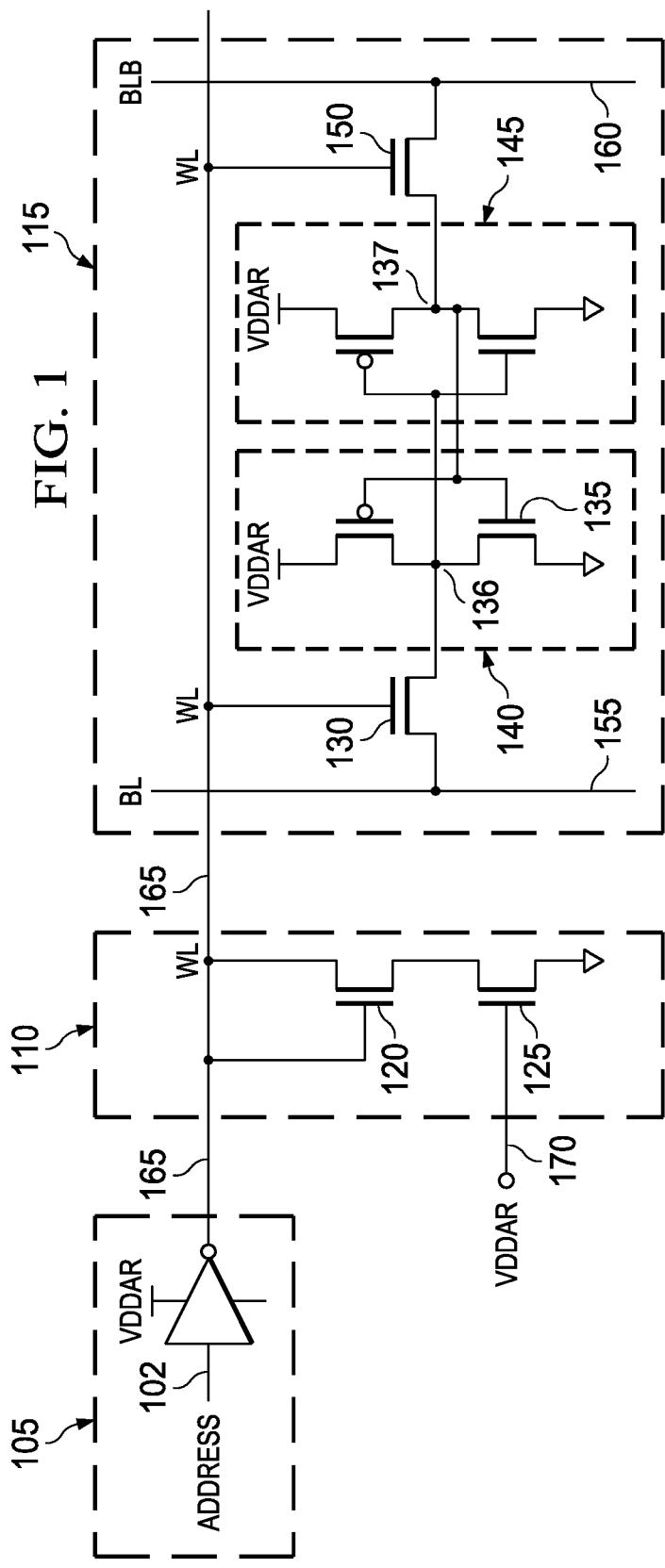
FIG. 1 illustrates a 6T SRAM with a word line suppression circuit according to an embodiment.

FIG. 1 illustrates a memory circuit according to an embodiment. Specifically, FIG. 1 illustrates a 6 transistor static random access memory (6T SRAM) with a word line suppression circuit 110 according to an embodiment. The 6T SRAM includes a word line driver 105 coupled to a word line (WL) on a line 165. The word line driver 105 receives an address select signal on line 102 (one location in the range of locations that can store data in an SRAM) and an array supply voltage (hereinafter referred to as VDDAR). An output of the word line driver 105 is connected to the word line on the line 165. The word line suppression circuit 110 includes a diode 120 connected in series to a switch 125 (it is noted that switch 125, transistor 125 and NMOS switch 125 are used interchangeably in the description and they mean the same). In one embodiment the switch is an NMOS transistor, herein after referred to as transistor 125. In other embodiments, a plurality of NMOS switches can be used instead on one NMOS switch. In one embodiment the diode (120) is an NMOS transistor, herein after referred to as transistor 120 (it is noted that transistor 120, diode 120 and NMOS diode 120 are used interchangeably in the description and they mean the same). In other embodiments, a plurality of NMOS diodes can be used instead of one NMOS diode. A gate of the transistor 125 receives VDDAR on a line 170. A bit cell 115 receives a word line, complementary bit lines (BL 155 and BLB 160) and VDDAR. The bit cell 115 (in an embodiment, the 6T SRAM) includes a pass transistor 130 with gate connected to the word line, drain connected to the BL and source connected to an inverter 140. Similarly, the bit cell includes another pass transistor 150 with gate connected to the word line, drain connected to BLB and source connected to an inverter 145. The inverter 140 includes a PMOS transistor (first load transistor) and an NMOS transistor 135 (first driver transistor). Source of the transistor 130 is connected to a node 132 which is defined between the drains of the PMOS and NMOS transistor (135) of the inverter 140. Similarly an inverter 145 includes PMOS and NMOS transistor wherein gates of the transistors of the inverter 145 are also connected to the node 132.

Figure 5:
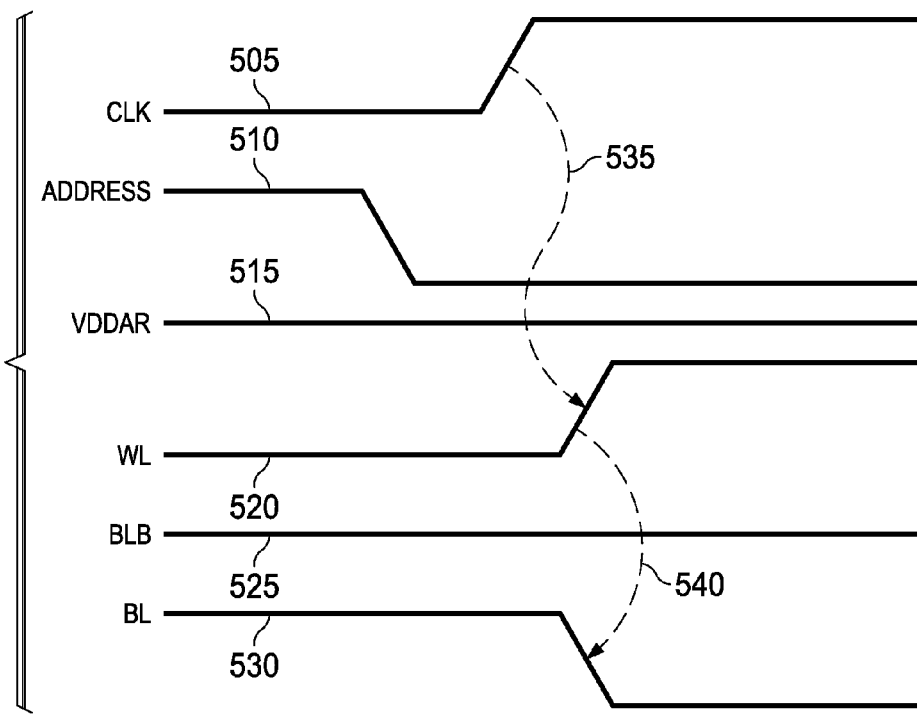
FIG. 5 illustrates a timing diagram of the 6T SRAM of FIG. 1.

Operation of the SRAM is explained using the timing diagram as illustrated in FIG. 5 and also using FIG. 1. Both read and write operations to the selected bit cells are performed by decoding the address which results in a word line (for example the word line 165) getting activated. In FIG. 5, 515 indicates VDDAR. An address select signal (510) selects a word line 520 upon the rising edge of CLK signal 505 (shown as 535). A read cycle results in the contents of the bit cell 115 to be coupled to the complementary bit lines (BL 530 and BLB 525). Based on the contents of the bit cell (0/1) either of BL 530 or BLB 525 is pulled low by the bit cell action (shown as 540). A WRITE cycle results in the contents of the SRAM bit cell to be coupled from the complementary bit line (BL 155 and BLB 160). During a read or a write operation, a rising transition on the word line 165, transistors 130 and 150 gets activated. When the transistors 130 and 150 are activated, and depending on the state of BL and BLB, the bit cell (formed by back to back connected inverters 140 and 145) is read from (read operation) or written into (write operation). When BL and BLB are pre-charged to high, before the onset of word line, the intended operation is read. When either of BL or BLB is pulled low to ensure the storage of the required state in the bit cell, then the intended operation is write. During a read '0' operation, due to the activation of both the driver transistor 130 and pass transistor 135, a resistive voltage drop occurs at node 136.

Depending on the magnitude of the voltage drop at node 136, the READ operation can manifest itself as an unwanted write operation when the value of the drop is sufficiently high to turn on the NMOS transistor in the inverter 145, thereby causing the node 137 to drop. Because of the back to back connection of inverters 140 and 145, a regenerative action develops and node 136 is pulled high resulting in the destruction of contents in the bit cell 115. If the word line voltage is reduced, the voltage at the node 136 is also reduced during the read operation. In one embodiment reduction in word line voltage is achieved by a word line suppression circuit 110. In other words, the word line suppression circuit 110 weakens the pass transistor 130 such that the voltage drop across the pass transistor 130 increases and the voltage drop between the pass transistor 130 and the driver transistor 135 reduces, thereby increasing the SNM. In an embodiment, there are several bit cells similar to bit cell 115 coupled to the word line 165 that also get activated by the same word line 165 and hence subject to the same word line suppression as explained above.

The need for word line suppression arises from the fact that a bit cell's (115) read operation is improved when the relative level of the word line reduces compared to the bit cell supply VDDAR. This results in the static noise margin (SNM) of the SRAM to be increased and hence ensures a robust read (it is noted that when SNM is high the read operation is more stable). In one embodiment, the word line suppression circuit 110 lowers the word line 165 by an amount determined by the sizing of the transistors 125 and 120 (diode). The term diode 120 and transistor 120 are used interchangeably and they refer to transistor 120. Existing circuits achieve suppression using only NMOS diodes coupled to the word line, in which case the diode action limits the word line voltage to a value lesser than VDDAR and hence results in word line suppression. In one embodiment, the transistor 125 coupled to the NMOS transistor 120 results in self regulation of the word line 165 over process, temperature and voltage variations. Regulation of word line voltage for a bit cell that needs static noise margin (SNM) improvement is a key attribute to ensure successful read over PVT ranges. The lack of regulation can render the read operation to fail even in the presence of word line suppression due to insufficient SNM at some corners of the PTV combinations.

One solution to regulation achieved through additional NMOS diodes in series with NMOS diode 120 results in a trade-off between read current (hence read access time, performance) and successful READ operation over the PTV range, hence a sub-optimal solution. In an embodiment, regulation is achieved by the VGS (gate to source voltage) and VBS (body to source voltage) control of the NMOS diode 120 brought about by the suitable sizing of the NMOS switch 125 without compromising the read current. The current through the switch 125 remains constant over the PVT range because of the following phenomenon: when the threshold voltage of the NMOS diode 120 raises due to variation in PVT, the current through the NMOS switch 125 reduces resulting in a higher voltage drop across the NMOS switch 125. When the voltage drop across the NMOS switch 125 increases, it lowers the VGS and VBS of the NMOS diode 120 and increases the current through the NMOS diode 120, hence regulates the voltage drop of Word line 165. The switch 125 provides the VGS and VBS control to the diode 120. On the other hand, lowering of the threshold voltage of NMOS diode 120 raises the current through NMOS switch 125 which reduces the voltages drop across NMOS switch 125 with respect to the ground and hence increases the VGS and VBS of the NMOS diode 120. This reduces the current through NMOS diode 120 and hence adjusts the voltage drop of the word line 165. This explains the utility of the NMOS switch 125 compared to only NMOS diode 120 coupled to the word line voltage 165.

Figure 2:
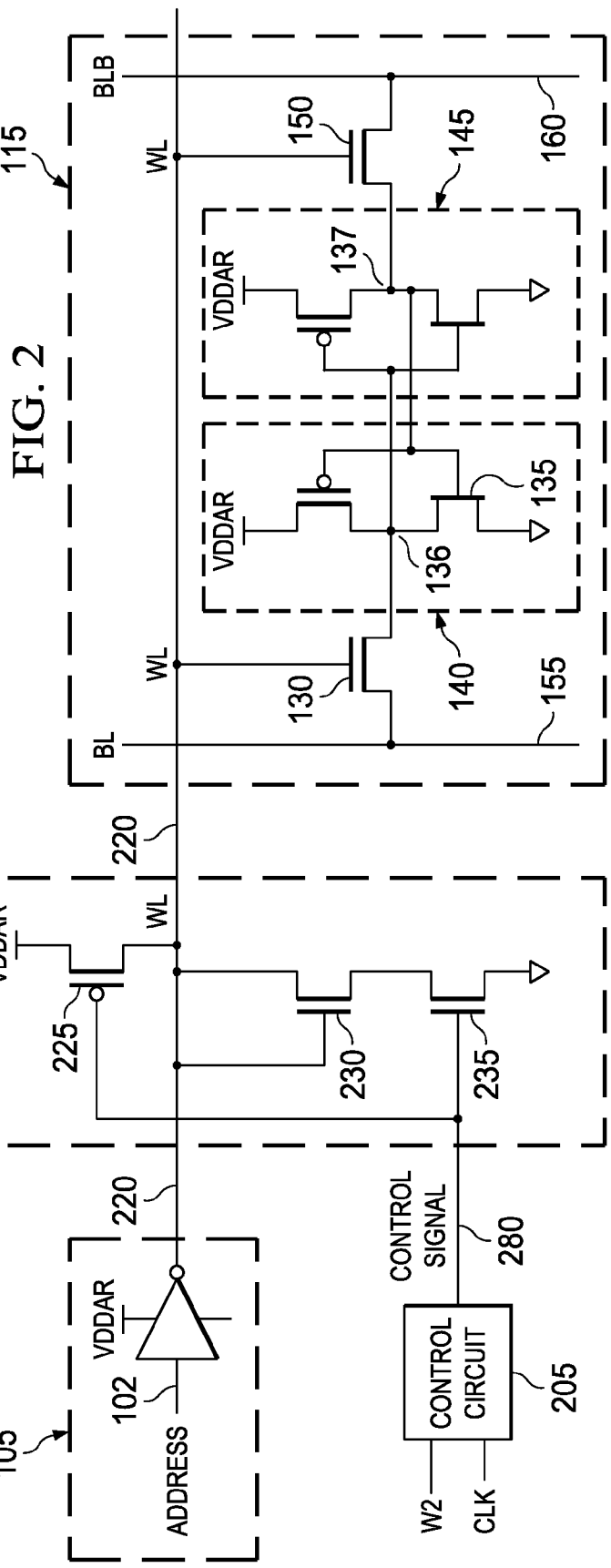
FIG. 2 illustrates a 6T SRAM with a word line suppression circuit according to another embodiment.

Another embodiment of the invention is illustrated in FIG. 2 having a 6T SRAM with a word line suppression circuit 210. The 6T SRAM with the word line suppression circuit in FIG. 2 is analogous to that of in FIG. 1. The word line driver 105 and the bit cell 115 is the same in connection as well as operation and are not explained again. FIG. 2 also includes a control circuit 205 that receives a clock signal (CLK) and read/write selection (WZ). The control circuit 210 is preprogrammed to generate the control signal 280. FIG. 2 also includes the word line suppression circuit 210 connected to the word line 220. The word line suppression circuit 210 includes a diode 230 connected in series to a switch 235. In one embodiment, the switch is an NMOS transistor, herein after referred to as transistor 235. In other embodiments, a plurality of NMOS switches can be used instead on one NMOS switch. In one embodiment the diode is an NMOS transistor, hereinafter referred to as transistor 230. In other embodiments, a plurality of NMOS diodes can be used instead of one NMOS diode. A gate of the transistor 235 receives a control signal 280 generated by the control circuit 205. The control signal 280 is also connected to PMOS transistor 225 having a source connected to VDDAR and drain coupled to the word line 220.

During a read operation, the control signal 280 activates the NMOS transistor 235 and diode 230, and deactivates the PMOS transistor 225. During the READ operation, the circuit operations in FIG. 1 and FIG. 2 are the same as far as the bit cell 115 is concerned. However, during a first write operation the control signal 280 activates the NMOS transistor 235 and diode 230, and deactivates the PMOS transistor 225. During the second write operation, control signal 280 activates the PMOS transistor, and deactivates the diode 230 and the NMOS transistor 235. It is noted that the first write operation and second write operation are two parts of the same write operation. The need for two part write operation arises from the fact that the bit cell coupled to the word line, but not intended/selected for a write operation undergoes a default read operation and hence subject to the same SNM issue as explained in the description of FIG. 1. In order to protect the contents of these bit cells, the first write operation provides the same word line suppression as in a read operation. The word line suppression circuit 210 is deactivated during the second write operation (using the control signal 280) in order to benefit the write operation for the selected bit cell 115. Also, during the write operation, the word line is not suppressed in FIG. 2 compared to FIG. 1 using control signal 280.

In an embodiment, there are several bit cells similar to bit cell 115 coupled to the word line 220 that also gets activated by the same word line 220 and hence subject to the same word line suppression as explained above.

Figure 6A:
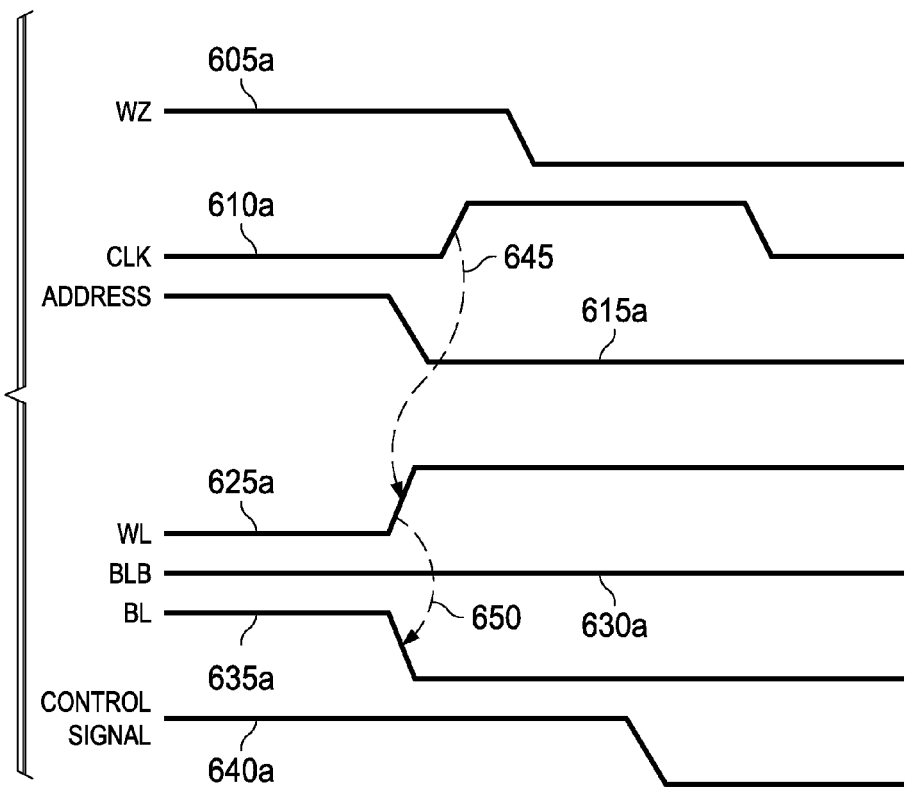
FIGS. 6a and 6b illustrate timing diagrams of the 6T SRAM of FIG. 2 in read and write operations.
Figure 6B:
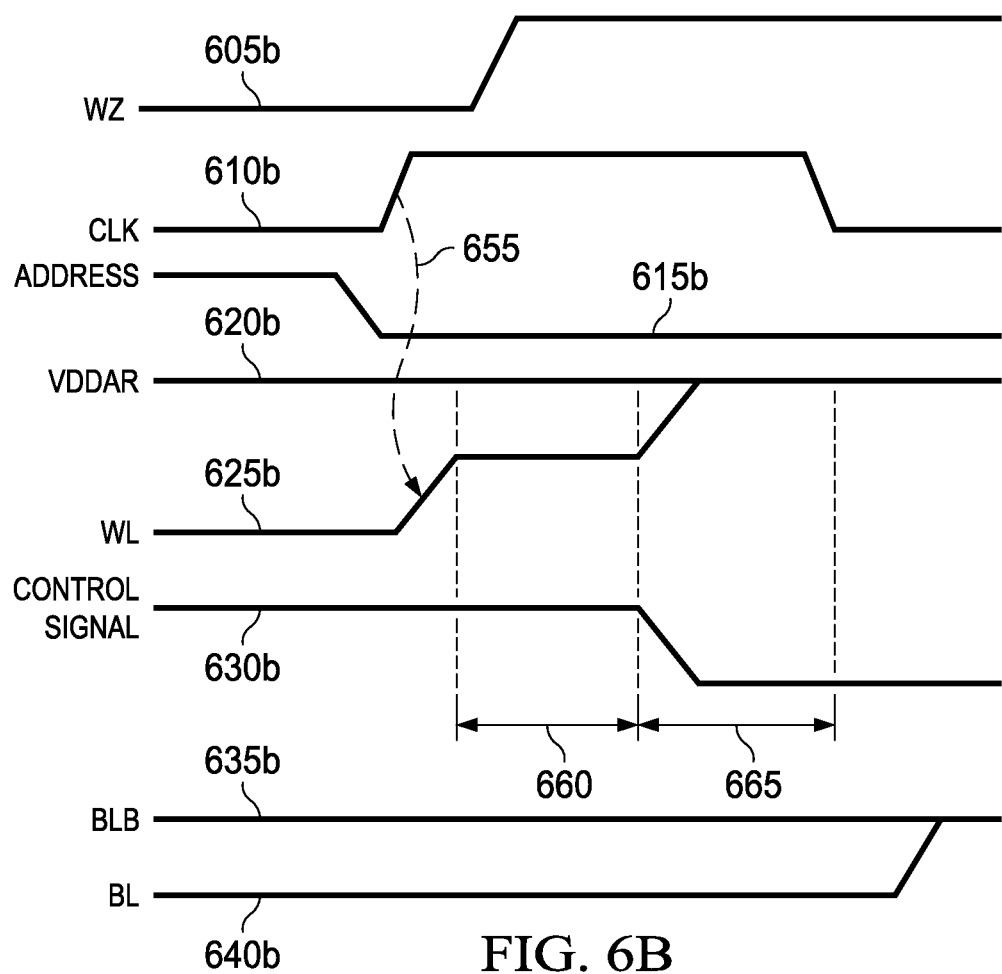

Operation of the circuit in FIG. 2 is now explained in detail using the timing diagram of FIGS. 6A and 6B. Both read and write operations to the selected SRAM cells (bit cell 115) is performed by decoding the address which results in a word line 625a getting activated. The WZ 605a is high which indicates that it is a read operation. In FIG. 6A, an address signal 615 selects a word line 625a upon the rising edge of CLK signal 610a (shown as 645). Based on the contents of the bit either BL 635a or BLB 630a will go low (shown as 650). Control signal 640a is generated based on WZ 605a and the CLK signal 610a and intended to be high during the positive level of the clock in one implementation. It is noted that the CLK signal 610a can be in a negative level in another implementation with accordingly synchronized appropriate signals at the falling edge of the CLK signal 610a.

Referring to FIG. 6B now, the WZ 605a being low indicates that it is a write operation. An address signal 615b selects a word line 625b upon the rising edge of CLK signal 610b as part of the first write operation 660 (shown as 655). Based on the contents of BL 635b or BLB 640b, the bit cell will get written with a 1 or a 0. Control signal 630b is generated based on WZ 605b and the CLK signal 610b and intended to be high during the first write operation and then to be low in the second write operation 665. During the first write operation 660, when the control signal 630b is high, the additional bit cells (that may be coupled to the same word line 625b and not shown in FIG. 2), not selected for write operation also gets the benefit of word line suppression circuit 210 due to the control signal 630b being high. This ensures that the contents of the additional bit cells are not disturbed due to the write operation on the bit cell 115. After the falling transition of the control signal 630b, as shown as 665 in FIG. 6b, the control signal 630b turns off the transistor 235 and the word line suppression circuit 210, turns on transistor 225 thereby restoring the word line 625b to the level of VDDAR 620b. It is noted that the CLK signal 610b can be in a negative level in another implementation with accordingly synchronized appropriate signals at the falling edge of the CLK signal 610b.

Figure 3:
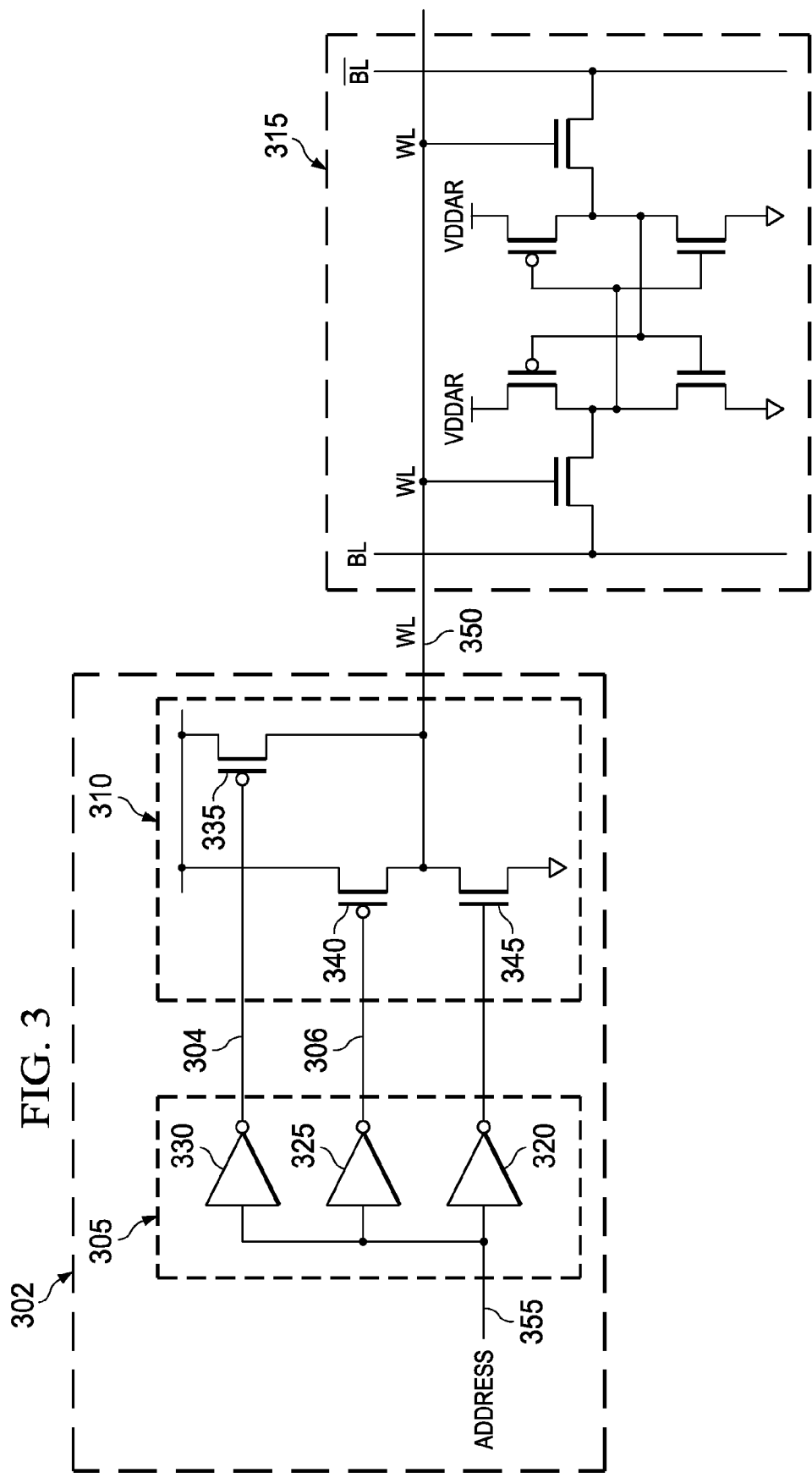
FIG. 3 illustrates a 6T SRAM with a word line suppression circuit according to another embodiment.

FIG. 3 illustrates a 6T SRAM with a word line suppression circuit according to another embodiment. FIG. 3 includes a bit cell 315 receiving a word line (on the line 350), complementary bit lines (BL and BLB) and an array supply voltage (VDDAR). A word line suppression circuit 302 is coupled to the word line that controls a slew rate of word line. The word line suppression circuit 302 includes a pre word line driver 305 and a final word line driver 310. The bit cell 315 is analogous to the bit cell 115 in connection as well as operation and is not repeated. The pre word line driver 305 receives an address select signal on line 355. The pre word line driver 305 includes, in one example embodiment, three inverters 330 (first delay element), 325 (second delay element) and 320, each of the inventers receive the address select signal. Each of the inventers are formed by gate connected PMOS transistor and NMOS transistor. The final word line driver 310 includes two PMOS transistors 335 and 340 and an NMOS transistor 345. In one embodiment, the NMOS transistor of the inverter 325 is a strong NMOS transistor compared to the NMOS transistor of the inverter 330. In various embodiments a strong transistor is defined as having higher W/L ration where W is the channel width and L is the channel length of the transistor. In various embodiments, a strong transistor can have a lower threshold voltage thereby having an ON current. Similarly, the PMOS transistor 335 is a strong transistor compared to the PMOS transistor 340. Gates of the transistors 335 and 340 are controlled by the control signals which are generated as outputs from the inventers 330 and 335 respectively. The drains of the PMOS transistors 335 and 340 are coupled to the word line 350. The final word line driver 310 also includes an NMOS transistor 345 having a drain coupled to the word line 350 and a source coupled to ground. Gate of the NMOS transistor 345 is controlled by an output of the inverter 320.

The control signals on lines 304 and 306 are delayed with respect to each other dependant on sizes of the PMOS transistors 335 and 340 of the final word line driver 310. The PMOS transistor 335 is activated prior to activating the PMOS transistor 340 by delaying the control signal on the line 306 with respect to the control signal on the line 304 such that a slew rate of the word line is controlled. Due to the fact that the NMOS of inverter 325 is stronger compared to the NMOS of the inverter 330, a falling edge of the control signal (306) arrives earlier than that of the control signal 304. This ensures that the PMOS transistor 340 is activated prior to PMOS transistor 335. Because of prior activation of the weaker transistor 340 compared to the transistor 335, the transistor 340 pulls up the word line 350 prior to the transistor 335. However, since the transistor 340 is weaker compared to 335, the slew rate of the word line 350 will be higher compared to the slew rate if the transistor 335 was to pull up the word line 350. This phase of activation of transistor 340 form a first phase of the two phases of the word line activation. The poor slew rate during the first phase of word line activation acts as a word line suppression mechanism and therefore helps the bit cell 315 to overcome the problem of SNM as explained earlier in conjunction with FIG. 1. Upon the activation of PMOS transistor 335, the slew rate of word line 350 is improved in the second phase of word line activation due to the higher strength of the transistor 335. Higher slew rate of the world line 350 helps to alleviate the effect of word line suppression on the write operation.

Figure 4:
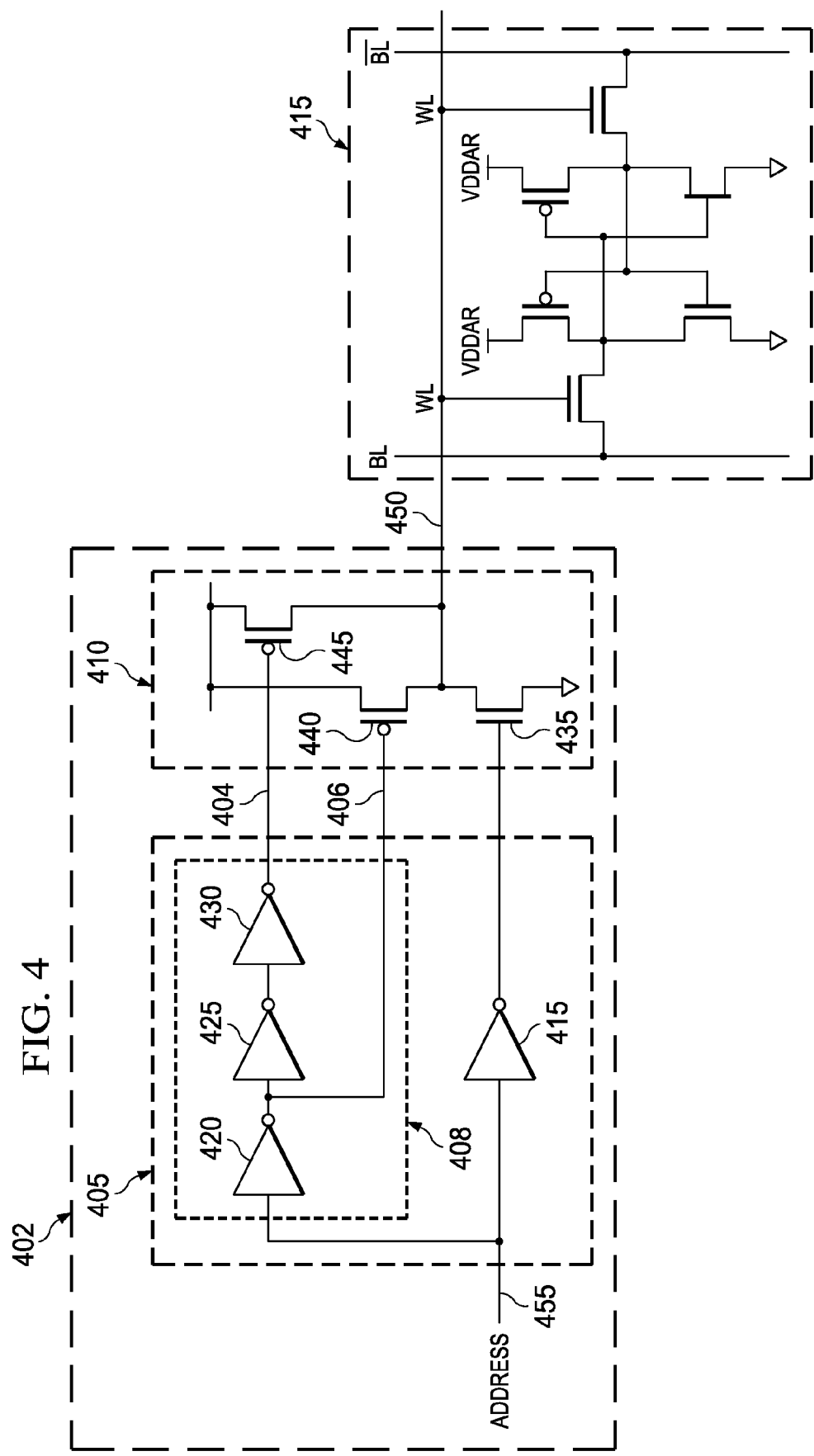
FIG. 4 illustrates a 6T SRAM with a word line suppression circuit according to another embodiment.

FIG. 4 illustrates a 6T SRAM with a word line suppression circuit according to another embodiment. FIG. 4 includes a bit cell 415 receiving a word line (on the line 450), complementary bit lines (BL and BLB) and an array supply voltage (VDDAR). A word line suppression circuit 402 is coupled to the word line 450 that controls a slew rate of word line. The word line suppression circuit 402 includes a pre word line driver 405 and a final word line driver 410. The bit cell 415 is analogous to the bit cells 115 and 315 in connection as well as operation and is not repeated. The final word line driver 410 includes two PMOS transistors 445 and 440 and an NMOS transistor 435. Similarly, the PMOS transistor 445 is a strong transistor compared to the PMOS transistor 440. Gates of the transistors 440 and 445 are controlled by the control signals which are generated as outputs from the inventers 420 and 430 respectively. The drains of the PMOS transistors 440 and 445 are coupled to the word line 450. The final word line driver 410 also includes an NMOS transistor 435 having a drain coupled to the word line 450 and a source coupled to ground. Gate of the NMOS transistor 435 is controlled by an output of the inverter 415. The pre word line driver 405 receives an address select signal on line 455. The pre word line driver 405 includes, in one example embodiment, four inverters, where inverters 420 (inverter 420 forming a first delay element), 425 and 430 (inverters 425 and 430 forming a second delay element) forming a delay chain 408. Inverters 420 and 415 receive the address select signal on line 455. Each of the inventers are formed by gate connected PMOS transistor and NMOS transistor. Two control signals are generated from the pre word lie driver 405, one from the output of the delay chain 408 on the line 404 and the other from the output of the inverter 420 on line 406. Gate of the transistor 445 receives the control signal on the line 404 and gate of the transistor 440 receives the control signal on the line 406.

The control signals on lines 404 and 406 are delayed with respect to each other by selecting the outputs (control singles) from different points of the delay chain 408. The PMOS transistor 440 is activated prior to activating the PMOS transistor 445 by delaying the control signal on the line 404 with respect to the control signal on the line 406 such that a slew rate of the word line is controlled. Due to the fact that a falling edge of the control signal 406 arrives earlier than that of the control signal 304, the transistor 440 pulls up the word line 450 prior to the transistor 445. However, since the transistor 440 is weaker compared to 445, the slew rate of the word line 450 will be higher compared to the slew rate if the transistor 445 was to pull up the word line 450. This phase of activation of transistor 440 forms a first phase of the two phases of the word line activation. The poor slew rate during the first phase of word line activation acts as a word line suppression mechanism and therefore helps the bit cell 415 to overcome the problem of SNM as explained earlier in conjunction with FIG. 1. Upon the activation of PMOS transistor 445, the slew rate of word line 450 is improved in the second phase of word line activation due to the higher strength of the transistor 445. Higher slew rate of the world line 450 helps to alleviate the effect of word line suppression on the write operation.

In the foregoing discussion, the term "connected" means at least either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal. It is to be understood that the term transistor can refer to devices including MOSFET, PMOS, and NMOS transistors. Furthermore, the term transistor can refer to any array of transistor devices arranged to act as a single transistor.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A memory circuit comprising:
   a bit cell that receives a word line, complementary bit lines and an array supply voltage;
   a word line driver coupled to the word line, the word line driver receiving one of the array supply voltage and a periphery supply voltage; and
   a word line suppression circuit coupled to the word line, the word line suppression circuit comprising a diode and a switch coupled in series, the switch being responsive to the array supply voltage.

2. The circuit of claim 1, wherein:
   the word line driver receives an address select signal;
   the word line receives a word line voltage from the word line driver; and
   the bit cell includes a static random access memory (SRAM).

3. The circuit of claim 1, wherein the switch controls the diode in response to the array supply voltage.

4. The circuit of claim 3, wherein the word line suppression circuit limits the word line voltage to a value lower than the array supply voltage such that static noise margin (SNM) of the SRAM is increased.

5. The circuit of claim 4, wherein the switch and the diode are sized to attain the value.

6. The circuit of claim 5, wherein the switch in conjunction with the diode form a self regulation mechanism to provide the value across process voltage and temperature (PVT) variations.

7. The circuit of claim 6, wherein the switch provides the gate to source voltage (VGS) and body to source voltage (VBS) control to the diode.

8. The circuit of claim 1, wherein the switch comprises an NMOS transistor.

9. The circuit of claim 1, wherein the bit cell comprises:
   a first pass transistor coupled to a first inverter, the first inverter comprising of a first load transistor and a first driver transistor, and
   a second pass transistor coupled to a second inverter, the second inverter comprising of a second load transistor and a second driver transistor,
   wherein the word line suppression circuit weakens the first pass transistor such that the voltage drop across the first pass transistor increases and the voltage drop between the first pass transistor and the first driver transistor reduces, thereby increasing the SNM.

\* \* \* \* \*